(12) United States Patent
Ma

(10) Patent No.: US 7,909,631 B2
(45) Date of Patent: Mar. 22, 2011

(54) ELECTRICAL CONNECTOR ASSEMBLY

(75) Inventor: Hao-Yun Ma, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/547,504

(22) Filed: Aug. 26, 2009

(65) Prior Publication Data
US 2010/0055937 A1    Mar. 4, 2010

(30) Foreign Application Priority Data

Aug. 26, 2008 (TW) .............................. 97215284 U

(51) Int. Cl.
*H01R 13/62*    (2006.01)
(52) U.S. Cl. ......................................... 439/331; 439/73
(58) Field of Classification Search .................. 439/331, 439/73
See application file for complete search history.

(56) References Cited

U.S. PATENT DOCUMENTS

| | | | |
|---|---|---|---|
| 6,676,429 B1 * | 1/2004 | McHugh et al. | 439/331 |
| 6,869,303 B1 * | 3/2005 | Ma | 439/331 |
| 7,001,197 B2 | 2/2006 | Shirai et al. | |
| 7,033,198 B2 | 4/2006 | Chiang | |
| 7,160,130 B2 | 1/2007 | Ma | |
| 7,210,952 B2 * | 5/2007 | Ishida | 439/331 |
| 7,338,308 B2 * | 3/2008 | Nakao et al. | 439/331 |
| 2006/0199413 A1 * | 9/2006 | Ju | 439/331 |

FOREIGN PATENT DOCUMENTS

TW    M325633    2/2008

* cited by examiner

*Primary Examiner* — Gary F. Paumen
(74) *Attorney, Agent, or Firm* — Andrew C. Cheng; Wei Te Chung; Ming Chieh Chang

(57) ABSTRACT

An electrical connector assembly (100) includes an insulative housing (1), a number of contacts (7) received in the insulative housing (1), a loading arrangement (3) covered the insulative housing (1), a pressing member (2) pressing the loading arrangement (3) and a fix member (4) pressing the pressing member (2) to securely locate the pressing member (2) on the insulative housing (1). The loading arrangement (3) defines a body plate (31) and a tab (32) extending from the body plate (31). The pressing member (2) defines a pressing portion (211) for pressing the tab (32) of the loading arrangement (3) and a stop portion (212) located on the insulative housing (1).

17 Claims, 4 Drawing Sheets

US 7,909,631 B2

ELECTRICAL CONNECTOR ASSEMBLY

BACKGROUND OF THE INVENTION

1. Field of the Invention

The present invention relates to an electrical connector assembly, and more particularly, to an electrical connector assembly having novel locking device to make the loading arrangement to be locked and opened easily.

2. Description of the Prior Art

U.S. Pat. No. 7,160,130 issued to Ma on Jan. 9, 2007 discloses a conventional electrical connector for electrically connecting a CPU with a PCB. The electrical connector comprises a socket body having a number of terminals, a stiffener attached to the socket body, a load plate and a load lever pivotally mounted to two ends of the stiffener respectively. The load plate comprises a body plate and a pressing side with an interlocking element at one end thereof extending forwardly from the body plate. The load lever is formed by bending a single metallic wire and includes a pair of rotary shafts, a locking section disposed between the rotary shafts and an actuating section for rotating the rotary shafts is bent at a right angle with respect to the rotary shafts, a distal end of the actuating section is formed into a U-like shape in order to form a handle for ease of actuation.

When the CPU is assembled to the socket body, the load plate is pivoted to a closed position and is locked by the locking section of the load lever. Thus the load plate exerts a force on the CPU to make a good electronic connection between the CPU and the terminals of the electrical connector.

However, When the load lever is operated to make the load plate at the closed position, the interlocking element must be lower than the locking section, otherwise, the locking section can not press against the interlocking element, as a result the locking section can not drive the load plate to create enough download force for providing a reliable interconnection between the CPU and the socket.

In view of the above, a new electrical connector assembly that overcomes the above-mentioned disadvantages is desired.

SUMMARY OF THE INVENTION

Accordingly, an object of the present invention is to provide an electrical connector assembly having a unique locking device to make it easy to lock or open the loading arrangement.

To fulfill the above-mentioned object, an electrical connector assembly comprises an insulative housing, a plurality of contacts received in the insulative housing, a loading arrangement covered the insulative housing, a pressing member pressing the loading arrangement and a fix member pressing the pressing member to securely locate the pressing member on the insulative housing, the loading arrangement defines a body plate and a tab extending from the body plate, the pressing member defines a pressing portion at one end pressed the tab of the loading arrangement and a stop portion at the opposite end located on the insulative housing.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
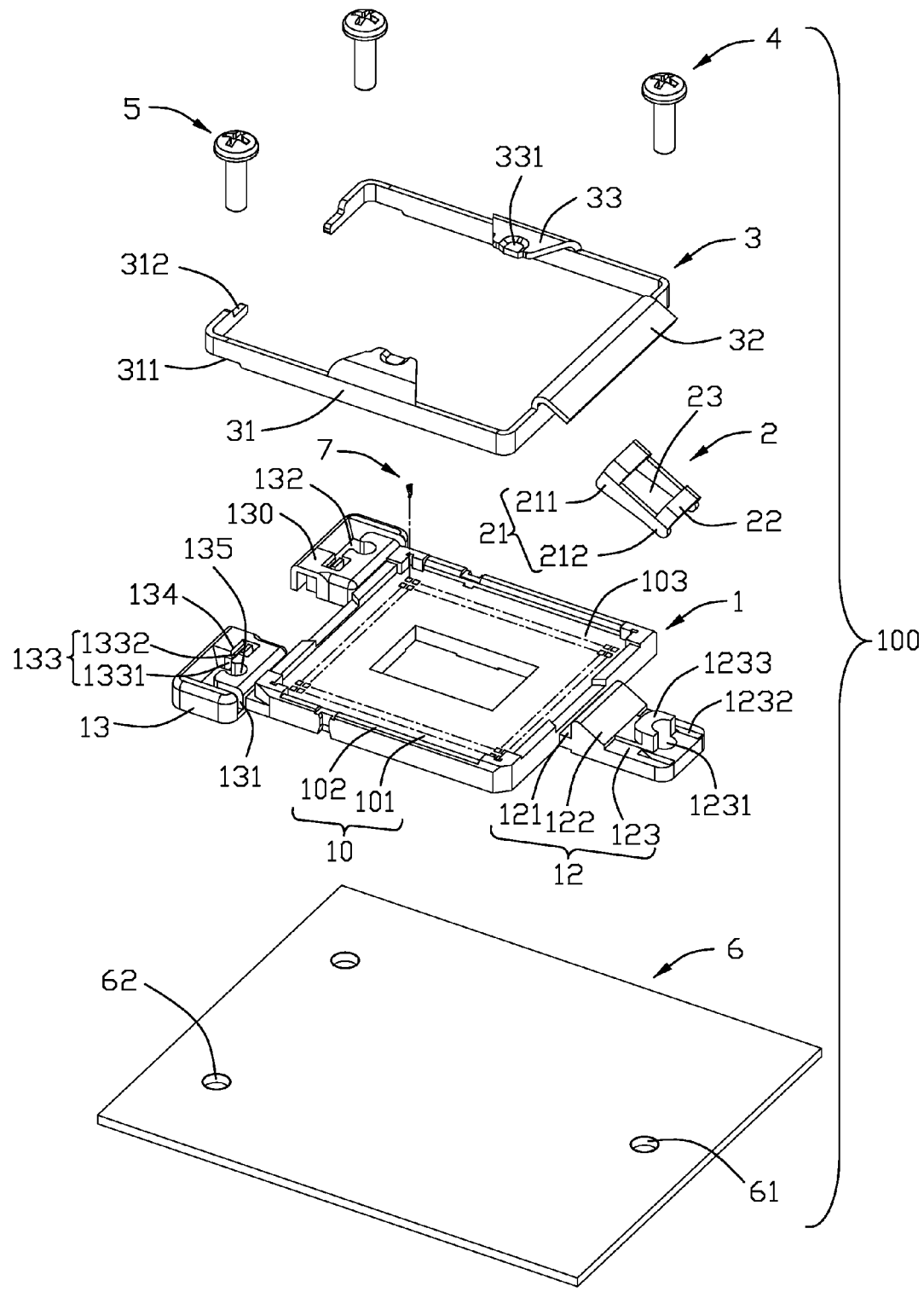
FIG. 1 is an exploded view of an electrical connector assembly in accordance with a preferred embodiment of the present invention.

Referring to FIG. 1, the electrical connector assembly 100 is used for electrically connecting an electronic package, such as a land grid array (LGA) central processing unit (CPU) (not shown), with a circuit substrate, such as a PCB 6. The electrical connector assembly 100 comprises an insulative housing 1 with a plurality of contacts 7 received therein, a loading arrangement 3 surrounding on the insulative housing 1, a pair of fastening members 5 for assembling the loading arrangement 1 on the PCB 6, a pressing member 2 for pressing the loading arrangement 3 toward the insulative housing 1, and a fix member 4 for assembling the pressing member 2 on the insulative housing 1.

The insulative housing 1 comprises a receiving portion 10, a tongue portion 12 extending from one end of the receiving portion 10 and a pair of anchoring devices 13 extending from the other end of the receiving portion 10. The receiving portion 10 is configured to have a rectangular shape and comprises a bottom wall 101, four sidewalls 102 extending upwardly from periphery of the bottom wall 101 and a receiving space 103 formed by the bottom wall 101 and the sidewalls 102. The receiving space 103 is used to receive the CPU. The contacts 7 are received in the bottom wall 101 with a contact portion (not labeled) extending into the receiving space 103 for electrically connecting with the CPU.

The tongue portion 12 is located on the middle of the sidewall 102 and comprises a fixing portion 123, a protruding portion 122 and a connecting portion 121 located between the fixing portion 123 and the protruding portion 122. The fixing portion 123 defines a supporting portion 1233 with a semicircular shape, a hole 1231 penetrated through the supporting portion 1233 and a pair of grooves 1232 located on the two sides of the hole 1231. The protruding portion 122 is configured to have a right-angle triangle shape.

The anchoring device 13 is located on two ends of the opposite sidewall 102 and comprises a top surface 130 far away from the PCB 6. The top surface 130 defines a first slot 131, a second slot 132, a third slot 133 and an aperture 135. There is a distance between the first slot 131 and the sidewall 102 of the insulative housing 1. The second slot 132 is perpendicular to the first slot 132. The third slot 133 is communicated with the second slot 132 and the second slot 132 is wider than the third slot 133. The third slot 133 and the second slot 132 are located in a line, and the aperture 135 is communicated with the second slot 132 and positioned near the receiving portion 10. A lower portion 1331 of the third slot 133 is wider than an upper portion 1332 thereof. The upper portion 1332 of the third slot 133 defines an interlock portion 134.

The loading arrangement 3 is made from metal and comprises a body plate 31, a tab 32 extending forwardly from the body plate 31 and a pair of hold-down devices 33 extending toward each other. The body plate 31 is configured to have a frame shape with two ends thereof extend to each other but not connected. Each of the ends of the body plate 31 has a receiving portion 311 with a hold portion 312. The receiving portion 311 is wider than the hold portion 312 whereby forms a step in an upper end of the body plate 31. The receiving portion 311 is thinner than the body plate 31 whereby forms a step in the lower end of the body plate 31. The hold-down device 33 defines a pressing point 331 extending to the insulative housing 1 to press the CPU. It is noted that the loading arrangement 3 is essentially of a long strap configuration originally, and successively bent with four sides and four corners for surrounding the housing and for material saving and weight lightening in comparison with the traditional load plate formed by a stamped metal plate.

The pressing member 2 comprises a body portion 21 and a receiving space 23. The body portion 21 comprises a stop portion 212 located in the groove 1232 of the insulative housing 1 and a pressing portion 211 opposite to the stop portion 212. The pressing portion 211 presses the tab 32 of the loading arrangement 3. In this embodiment, the pressing member 2 comprises a pair of body portions 21 paralleled to each other and a connecting portion 22 with an arc shape connected with the two stop portions 212. The receiving space 23 is formed by the body portions 21 and the connecting portion 22.

The fastening members 5 and the fix member 4 are screws in this embodiment. The PCB 6 defines a fixing hole 61 corresponding to the hole 1231 and a through hole 62 corresponding to the aperture 135 of the insulative housing 1.

Figure 2:
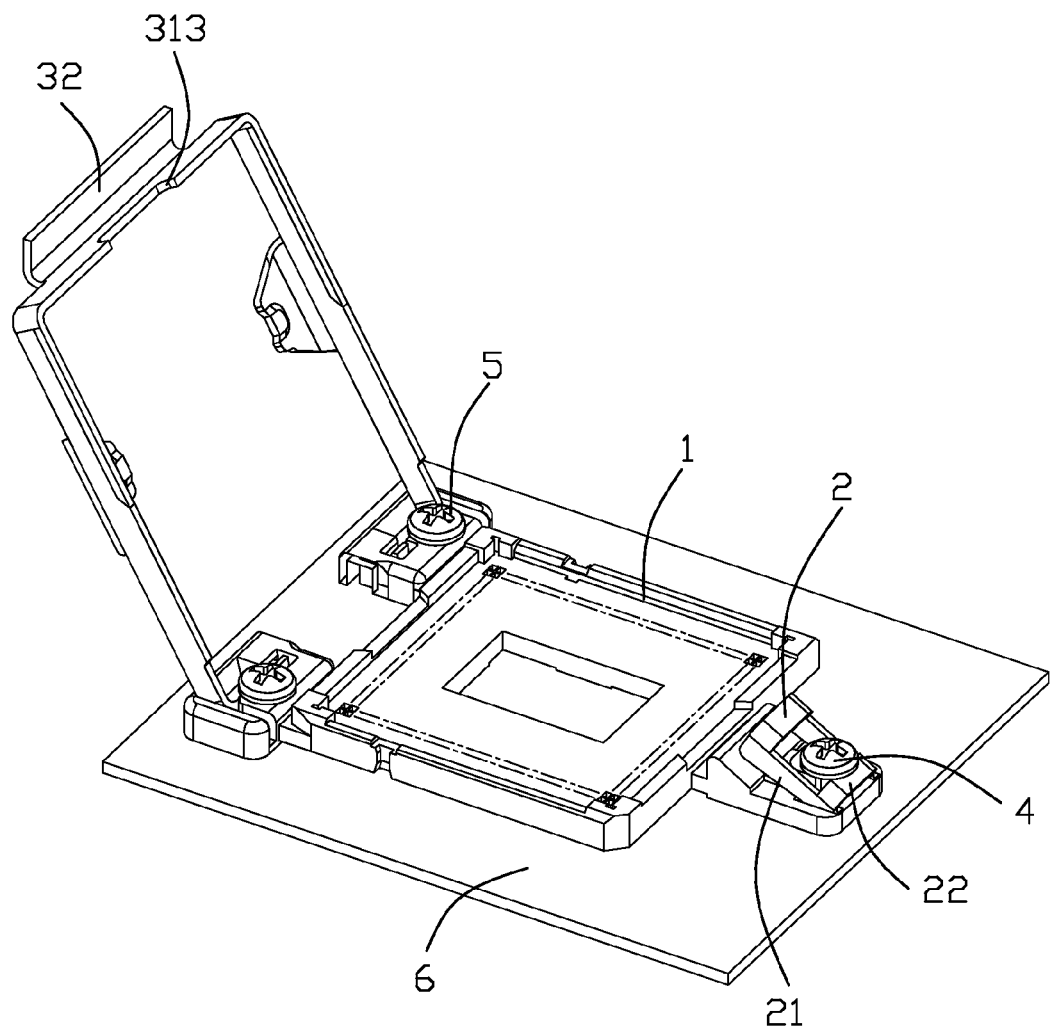
FIG. 2 is an assembled view of the electrical connector assembly shown in FIG. 1, showing the loading arrangement is in an open position.

Referring to FIG. 2, showing an assembled view of the prevent invention. The housing 1 is disposed on the PCB 6, one end of the body plate 31 is received in the second slot 132, and the fastening member 5 firstly goes through the aperture 135 to make the loading arrangement 3 pivotally mount on the insulative housing 1, and then goes through the through hole 62 to make the insulative housing position on the PCB securely. When the loading arrangement 3 is rotated to the opened position, the hold portion 312 is interlocked with the interlock portion 134 to prevent the loading arrangement from falling off the insulative housing 1. The stop portion 212 is received in the groove 1232, the fix member 4 goes through the hole 1231 and the fixing hole 61 to assemble the pressing member 2, the insulative housing 1 and the PCB 6 together securely. The body plate 31 also defines a recess 313 located below the tab 32.

Figure 3:
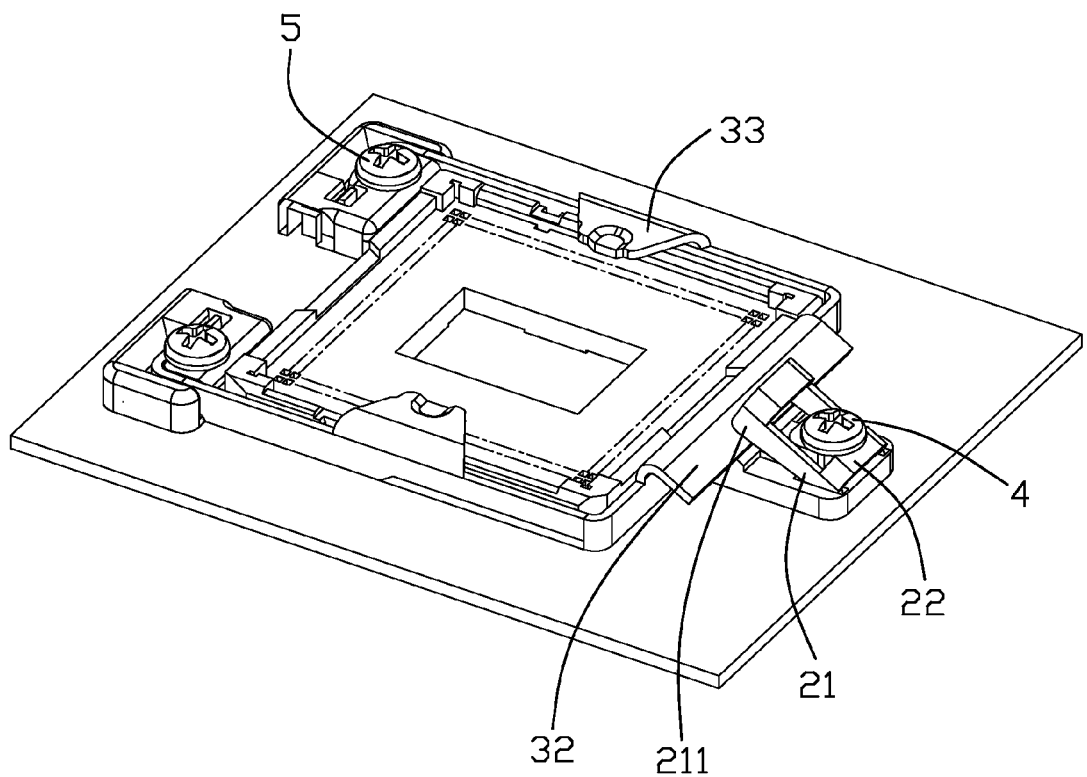
FIG. 3 is similar to FIG. 2, showing the loading arrangement is in a closed position and the loading arrangement is locked to the pressing member.
Figure 4:
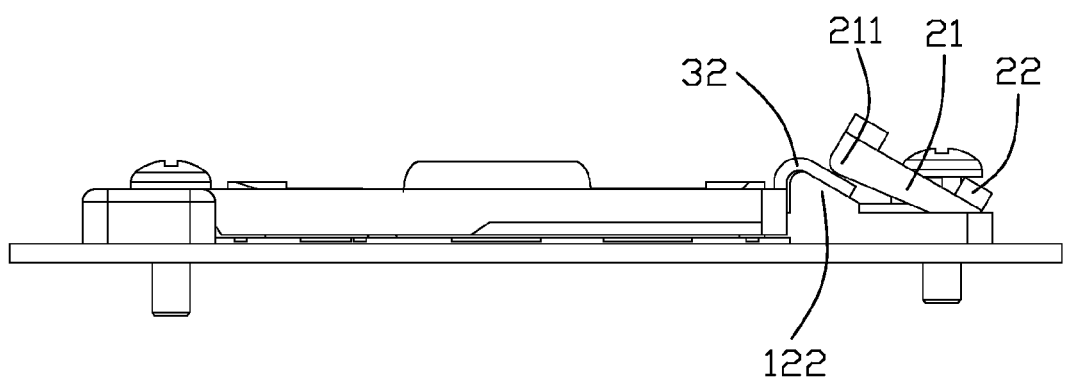
FIG. 4 is a side view of the electrical connector assembly shown in FIG 3.

Referring to FIGS. 3-4, when the loading arrangement 3 is in the closed position, the receiving portion 311 is located in the first slot 131, and the second slot 132 and the third slot 133, so the body plate 31 is closer to the PCB 6. The recess 313 matches the connecting portion 121 to prevent the loading arrangement 3 interferencing with the insulative housing 1. The tab 32 locates on the protruding portion 122, and the pressing portion 211 presses the tab 32. The fix member 4 is rotated downwardly and then presses the connecting portion 22, and the pressing portion 211 to go downwardly to press the tab 32. When the fix member 4 touches the supporting portion 1233, the loading arrangement 3 can press the CPU and reliable a good connection between the CPU and the contacts 7 of the electrical connector assembly 100.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:
    an insulative housing;
    a plurality of contacts received in the insulative housing;
    a loading arrangement surrounding the insulative housing for holding an electronic package upon the housing;
    a pressing member including at one end thereof a pressing portion pressing the loading arrangement; and
    a fix member being discrete from while pressing the pressing member to secure the pressing member in position relative to the housing; wherein the loading arrangement includes a body plate and a tab extending from the body plate and pressed by the pressing member which further includes at the other end a stop portion located on the insulative housing, and the fix member secures the pressing member to the housing, and wherein the insulative housing comprises a receiving portion, a tongue portion extending from one end of the receiving portion and a pair of anchoring devices extending from the other end of the receiving portion.

2. The electrical connector assembly as claimed in claim 1, wherein the body plate is pivotally assembled on the anchoring device.

3. The electrical connector assembly as claimed in claim 1, wherein the tongue portion comprises a hold-down portion, a protruding portion and a connecting portion located between the hold-down portion and the protruding portion.

4. The electrical connector assembly as claimed in claim 3, wherein the body plate defines a recess located below the tab to match with the connecting portion.

5. The electrical connector assembly as claimed in claim 3, wherein the tab is located on the protruding portion of the insulative housing.

6. The electrical connector assembly as claimed in claim 3, wherein the hold-down portion defines a hole and a groove on a side of the hole.

7. The electrical connector assembly as claimed in claim 6, wherein the fix member goes through the hole and presses the pressing member and the stop portion of the pressing member received in the groove.

8. The electrical connector assembly as claimed in claim 1, wherein said load arrangement is essentially of a long strap configuration originally, and successively bent with four sides and four corners to surround said housing for material saving and weight lightening 9. An electrical connector assembly comprising:
    an insulative housing defines a receiving portion, a tongue portion extending from one end of the receiving portion and a pair of anchoring devices extending from the other end of the receiving portion;
    a plurality of contacts received in the receiving portion of the insulative housing;
    a loading arrangement pivotally located on the anchoring device of the insulative housing and having a body plate and a tab extending from the body plate;
    a pressing member located on the tongue portion of the insulative housing and including a pressing portion at one end thereof and pressing the tab of the loading arrangement; and
    a fix member going through the pressing member and the tongue portion of the insulative housing to make the pressing member press the tab of the loading arrangement.

10. The electrical connector assembly as claimed in claim 9, wherein the tongue portion comprises a hold-down portion, a protruding portion and a connecting portion located between the hold-down portion and the protruding portion.

11. The electrical connector assembly as claimed in claim 10, wherein the body plate defines a recess located below the tab to match with the connecting portion.

12. The electrical connector assembly as claimed in claim 10, wherein the tab is located on the protruding portion of the insulative housing.

13. The electrical connector assembly as claimed in claim 10, wherein the hold-down portion defines a groove.

14. The electrical connector assembly as claimed in claim 13, wherein the pressing member defines a stop portion opposite to the pressing portion, and the stop portion is located in the groove.

15. An interconnecting system, comprising:
a printed circuit board;
an insulative housing disposed onto the printed circuit board and having a plurality of terminals assembled within the housing;
a pair of anchoring devices securely attached onto the printed circuit and adjacent to a first end of the insulative housing;
a lock-down device securely attached onto the printed circuit board and adjacent to a second and opposite end of the housing; and
a loading arrangement having a pair of pivotal shafts rotationally received in the pair of anchoring devices, and a frame portion surrounding a peripheral of the housing and a tab adjacent to the lock-down device, the loading arrangement including a pair of hold-down devices extending over a space above the insulative housing; wherein the lock-down device includes an inclined supporting surface on which the tab of the loading arrangement is supported.

16. The interconnecting system as recited in claim 15, wherein the hold-down device extending from the frame portion of the loading arrangement.

17. The interconnecting system as recited in claim 15, wherein the lock-down device includes a lock to securely hold the tab onto the inclined supporting surface.

* * * * *